United States Patent
Ban

(10) Patent No.: US 8,437,583 B2
(45) Date of Patent: May 7, 2013

(54) OPTICAL MODULE

(75) Inventor: Takuma Ban, Kokubunji (JP)

(73) Assignee: Oclaro Japan, Inc., Kanagawa (JP)

( * ) Notice: Subject to any disclaimer, the term of this patent is extended or adjusted under 35 U.S.C. 154(b) by 437 days.

(21) Appl. No.: 12/706,887

(22) Filed: Feb. 17, 2010

(65) Prior Publication Data

US 2010/0215324 A1  Aug. 26, 2010

(30) Foreign Application Priority Data

Feb. 20, 2009 (JP) .................................. 2009-037710

(51) Int. Cl.
*G02B 6/12* (2006.01)
*G02B 6/26* (2006.01)

(52) U.S. Cl.
USPC .............................................. 385/14; 385/31

(58) Field of Classification Search .................... 385/14, 385/31
See application file for complete search history.

(56) References Cited

U.S. PATENT DOCUMENTS

| | | | |
|---|---|---|---|
| 4,895,523 A * | 1/1990 | Morrison et al. ................ | 439/67 |
| 5,268,815 A * | 12/1993 | Cipolla et al. ................ | 361/704 |
| 5,768,776 A * | 6/1998 | Pendse ............................ | 29/852 |
| 5,857,974 A * | 1/1999 | Eberle et al. ................... | 600/462 |
| 6,049,958 A * | 4/2000 | Eberle et al. ................... | 29/25.35 |
| 6,536,871 B1 * | 3/2003 | Haddick et al. ................ | 347/50 |
| 6,551,113 B1 * | 4/2003 | Nishiyama et al. ............. | 439/67 |
| 7,030,477 B2 * | 4/2006 | Ishimura ........................ | 257/678 |
| 7,626,825 B2 * | 12/2009 | Takamatsu et al. ........... | 361/749 |
| 8,047,874 B2 * | 11/2011 | Ito ................................ | 439/607.1 |
| 2004/0054289 A1 * | 3/2004 | Eberle et al. ................... | 600/459 |
| 2005/0194663 A1 * | 9/2005 | Ishimura ........................ | 257/666 |
| 2005/0254172 A1 * | 11/2005 | Ichikawa et al. ............ | 360/234.5 |
| 2007/0066126 A1 * | 3/2007 | Dutta et al. .................... | 439/493 |
| 2007/0102830 A1 * | 5/2007 | Muto et al. .................... | 257/784 |
| 2008/0196929 A1 * | 8/2008 | Takamatsu et al. ........... | 174/254 |
| 2009/0000809 A1 * | 1/2009 | Yagisawa et al. ............. | 174/254 |
| 2009/0287090 A1 * | 11/2009 | Hadjicostis ................... | 600/471 |
| 2010/0126754 A1 * | 5/2010 | Koga ........................ | 174/105 R |
| 2010/0330844 A1 * | 12/2010 | Ito ................................ | 439/660 |
| 2011/0008056 A1 * | 1/2011 | Yagisawa ..................... | 398/182 |

FOREIGN PATENT DOCUMENTS

JP 2007-123741 A 5/2007

* cited by examiner

*Primary Examiner* — K. Cyrus Kianni
(74) *Attorney, Agent, or Firm* — Mattingly & Malur, PC

(57) ABSTRACT

An optical module having a flexible substrate having, even after actual manufacturing steps, excellent transmission characteristics of high-frequency signals and an advantage that electromagnetic field radiation is reduced even when it is connected with a package. The flexible substrate used in external connection of the package of the optical module uses a flexible substrate having a coplanar line to which a lead pin is fixedly attached, a grounded coplanar line which is in contact with the coplanar region, and a microstrip line which is in contact with the grounded coplanar line. The flexible substrate has an electrode layout in which an electromagnetic field component of a surface ground line and a signal line is more dominant than an electromagnetic field component of a back-surface ground line and the signal line in a region of the coplanar line adjacent to the grounded coplanar line.

12 Claims, 13 Drawing Sheets

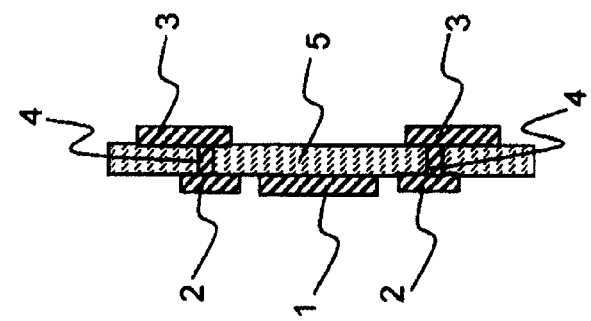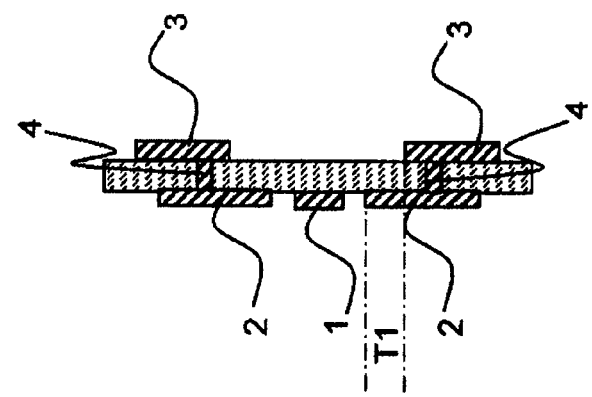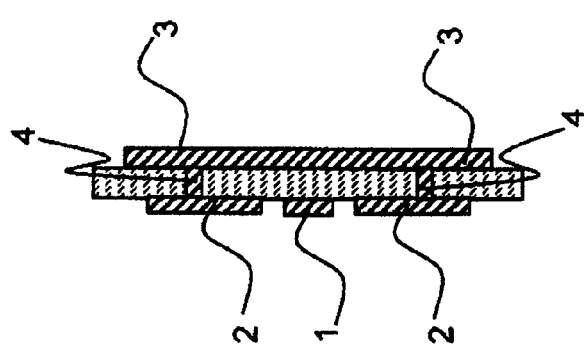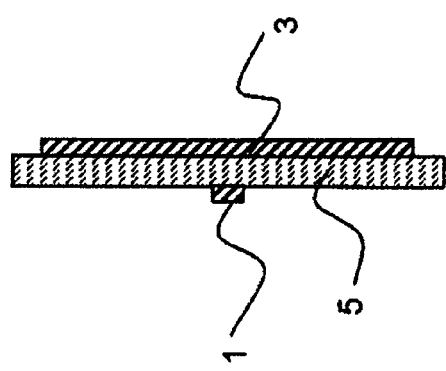

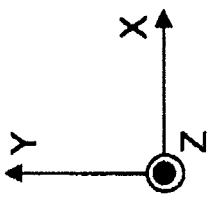
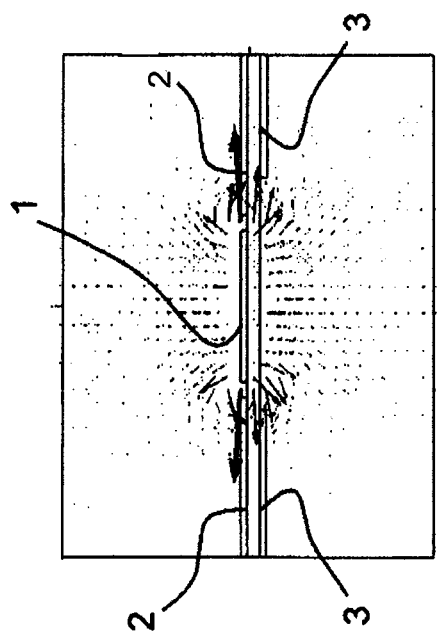
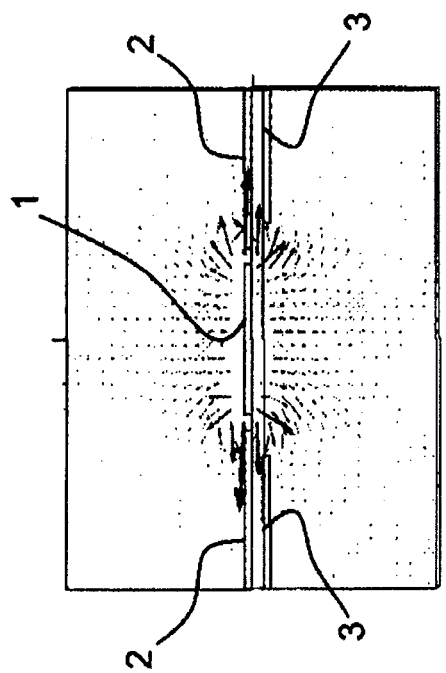

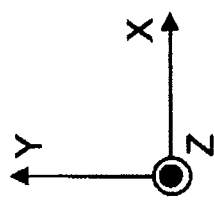
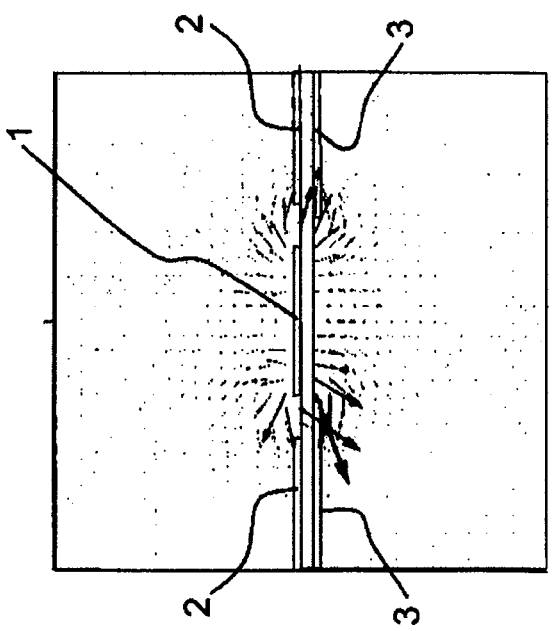
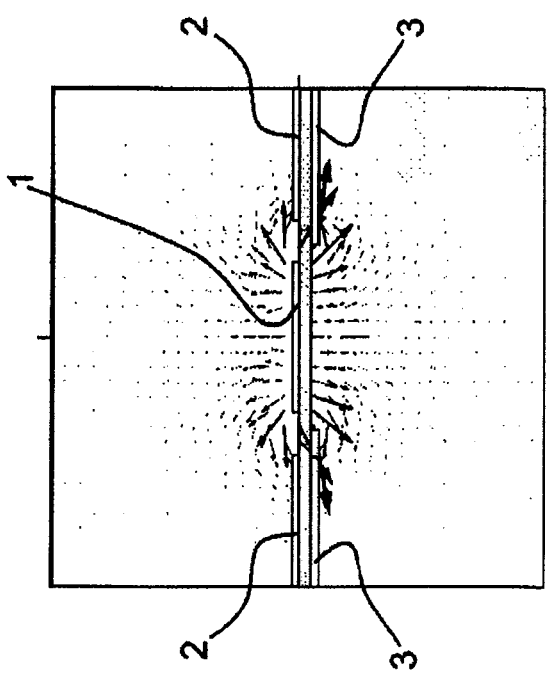
FIG. 16A
FIG. 16B

OPTICAL MODULE

CROSS-REFERENCE TO RELATED APPLICATION

The present application claims priority from Japanese Patent Application No. JP 2009-037710 filed on Feb. 20, 2009, the content of which is hereby incorporated by reference into this application.

TECHNICAL FIELD OF THE INVENTION

The present invention relates to an optical module and particularly relates to a flexible substrate and an optical module in which lead pins of a package (module housing for mounting optical elements) are fixedly attached to the flexible substrate.

BACKGROUND OF THE INVENTION

An optical communication network is composed of optical fibers serving as media for propagating optical signals and optical transceivers for transmitting/receiving optical signals. A housing of the optical transceiver encloses an optical module for converting electric signals to optical signals and optical signals to electric signals and a printed board on which electronic elements and electric connectors, etc. are mounted for control.

The optical module has a package, in which optical elements which carry out photoelectric conversion such as a laser (light emitting element) and a photodiode (light receiving element) are mounted, and a flexible substrate. Generally, such optical modules are sometimes called, for example, ROSA in the light-receiving side and TOSA in the light-transmitting side.

A Can-type package or a Box-type package is used as the package in which the optical elements are mounted, and lead pins are used for input/output of signals. The lead pins penetrate through the flexible substrate and are fixedly attached thereto by soldering; alternatively, the lead pins and the flexible substrate are disposed so as to be approximately horizontal to each other, and the lead pins are fixedly attached with conductors on the flexible substrate by soldering.

Such configurations of the optical modules are often utilized in optical transceivers supporting transmission speeds of about several hundred Mbps to 10 Gbps. Recently, optical modules complying with the standard called XMD have been commercialized by several companies.

Incidentally, a width of about 200 microns is often used as the width of the lead pin of the optical module in order to maintain the mechanical strength thereof. This lead pin of the package and a microstrip line having a width of 100 microns cannot be fixedly attached to each other by soldering.

A flexible substrate of Japanese Patent Application Laid-Open Publication No. 2007-123741 (Patent Document 1) has a structure of a transmission path in which a microstrip line is changed to a coplanar line, and the coplanar line is connected with a lead pin. The width of the signal line of the coplanar line is widened more than the width of the signal line of the microstrip line, thereby facilitating the connection with the lead pin.

In the specification of the present application, a "microstrip line" refers to a transmission path in which a first main surface (hereinafter, referred to as "surface") of a flexible substrate is provided with a signal line not sandwiched by surface ground lines, and a second main surface (hereinafter, referred to as "back surface") of the flexible substrate is provided with a back-surface ground line overlapped with the signal line; a "coplanar line" refers to a transmission path in which the surface of the flexible substrate is provided with the signal line sandwiched by the surface ground lines with gaps therebetween, and the back surface of the flexible substrate is provided with the back-surface ground line which is not overlapped with the signal line; and a "grounded coplanar line", which will be described later, refers to a transmission path in which the surface of the flexible substrate is provided with the signal line sandwiched by the surface ground lines, and the back surface of the flexible substrate is provided with the back-surface ground line overlapped with the signal line.

Above-described Patent Document 1 particularly employs a structure in which the distance between a signal line and each rectangular surface ground line is gradually narrowed since the line width of the signal line is gradually widened in a coplanar line in the region in which a microstrip line is changed to the coplanar line. In addition, this case employs a structure in which a back-surface ground line is branched so that the back-surface ground lines sandwich the signal line, wherein the distance between the ground line and the signal line is gradually increased.

SUMMARY OF THE INVENTION

The flexible substrate disclosed in above-described Patent Document 1 has a problem that reduction in transmission characteristics is readily caused due to the positional misalignment caused in a process described below.

In the manufacturing steps of the flexible substrate, the patterning of the conductor pattern of the surface and the conductor pattern of the back surface cannot be carried out at the same time. Generally, the conductor patterns are separately pasted onto a base film, or the patterning is carried out by separately subjecting the surface and the back surface to etching. In such cases, generally, positional misalignment of up to about 50 microns is caused between the conductor pattern of the surface and the conductor pattern of the back surface. If an attempt to eliminate the positional misalignment is made, productivity is significantly lowered. When this flexible substrate is used in external connection of the package of the optical module, an examination of the flexible substrate is required in advance. Therefore, if the structure does not readily affect the characteristics as a result of arrangement of the conductor layout of the flexible substrate, even when the positional misalignment of the surface/back surface conductor patterns is generated, such an examination step is no longer required to be carried out.

The structure of Patent Document 1 has a shape in which, in the region wherein the microstrip line is changed to the coplanar line, i.e., the region of the coplanar line adjacent to the microstrip line, the distance between the rectangular surface ground line and the signal line is reduced by the distance corresponding to the change in the width of the signal line, while the distance between the back-surface ground line and the signal line is gradually increased. Therefore, the region in which the microstrip line is changed to the coplanar line is in a state such that the distance between the back-surface ground line and the signal line is shorter than the distance between the surface ground line and the signal line. In this state, the electromagnetic field component generated between the back-surface ground line and the signal line becomes dominant. Therefore, when the positional misalignment between the conductor pattern of the surface and the conductor pattern of the back surface is generated, the electromagnetic field distribution becomes not laterally symmetrical with respect to the central axis of the signal line. Therefore, there has been a possibility that the characteristic impedance may be changed and deterioration in the transmission characteristics may be caused.

When such a flexible substrate is used for the connection with the lead pins of a package constituting an optical module, even though the actual electromagnetic field distributions in the left and right of the signal line of the coplanar line are not balanced in the flexible substrate, the electromagnetic field distribution of the transmission path in the package is designed so that the left and right electromagnetic field distributions are balanced. Therefore, in the connecting part of the package and the flexible substrate, the electromagnetic field distributions do not match, and radiation of electromagnetic waves is caused.

Thus, not only deterioration of high-frequency signals due to the shift in the characteristic impedance, but also deterioration of the high-frequency signals due to radiation of electromagnetic waves (noise) is caused. An optical transceiver using such an optical module readily causes operation failure.

The present inventor has found out this problem during a search for the cause of signal deterioration caused in usage of the optical module for the transmission of a high-frequency signal of 25 GHz. As a matter of course, the higher the frequency of the signals is, the more notable the problem becomes. However, as a result of an examination of the frequencies of less than 25 GHz, a similar problem was generated as long as the signals were 10 GHz or more.

In this manner, in the optical module using the conventional flexible substrate, characteristic deterioration of high-frequency signals is readily caused, and an examination of the flexible substrate has been inevitable in advance in order to prevent it.

The present invention has been accomplished in order to solve the above-described problems of the conventional techniques, and it is a preferred aim of the present invention to provide techniques capable of readily obtaining an optical module having excellent transmission characteristics.

The above and other preferred aims and novel characteristics of the present invention will be apparent from the description of the present specification and the accompanying drawings.

Typical ones of the inventions disclosed in the present application will be briefly described as follows.

The above-described problems can be solved when using a substrate as a flexible substrate connected with lead pins of a package, the substrate being provided with a coplanar line to which lead pins are fixedly attached, a grounded coplanar line which is in contact with the coplanar line, and a microstrip line which is in contact with the grounded coplanar line, wherein an electromagnetic field component of a surface ground line and a signal line is more dominant than an electromagnetic field component of a back-surface ground line and the signal line in an electrode layout of a region of the coplanar line being adjacent to the grounded coplanar line.

This one specific example is an electrode layout in which a distance between the surface ground line and the signal line of the coplanar line is shorter than a distance between the back-surface ground line and the signal line of the coplanar line in the region of the coplanar line being adjacent to the grounded coplanar line.

If the electromagnetic field of the surface ground line and the signal line is dominant at the point where the grounded coplanar line is switched to the coplanar line, conversion of the electromagnetic field distribution is smoothly carried out, and the influence exerted on the characteristics of the flexible substrate by the positional misalignment of the conductor patterns of the surface and the back surface is extremely small. Therefore, the parts examination which is carried out in order to suppress defects caused by the positional misalignment before the flexible substrate is connected to the lead pins can be simplified, and yield can be maintained to be high even without the parts examination. Moreover, since the impedance is not shifted, an optical module having small noise and excellent high-frequency transmission characteristics can be manufactured at a low cost with good reproducibility.

Other means for solving the above-described problems are described below.

(1) An optical module having: a circuit board; a flexible substrate connected to the circuit board; and a package including a lead pin, the lead pin being fixedly attached to the flexible substrate, wherein the flexible substrate includes a transmission path having a signal line, a surface ground line, and a back-surface ground line, the signal line and the surface ground line being provided on a first main surface of the flexible substrate, the surface ground line being arranged on the left and right of the signal line with a gap therebetween, and the back-surface ground line being provided on a second main surface of the flexible substrate opposed to the first main surface; the transmission path has a first region, a second region, and a third region in this order toward the package; the first region, the second region, and the third region include the signal line and the surface ground lines; furthermore, the first region includes the back-surface ground line overlapped with the signal line, the overlap being terminated within the first region; the third region does not include the back-surface ground line overlapped with the signal line; and the second region does not include the back-surface ground line or does include the back-surface ground line being disposed so that an electromagnetic field strength of the signal line and the surface ground line is larger than an electromagnetic field component between the signal line and the back-surface ground line.

(2) An optical module having: a circuit board; a flexible substrate connected to the circuit board; and a package including a lead pin, the lead pin being fixedly attached to the flexible substrate, wherein the flexible substrate includes a transmission path having a signal line, surface ground lines, and a back-surface ground line, the signal line and surface ground lines being provided on a first main surface of the flexible substrate, the surface ground lines being arranged on the left and right of the signal line with a gap therebetween, and the back-surface ground line being provided on a second main surface of the flexible substrate opposed to the first main surface; the transmission path includes a first region, a second region, and a third region in this order toward the package; the first region, the second region, and the third region include the signal line and the surface ground lines; the first region includes the back-surface ground line which is overlapped with the signal line and terminated within the first region; the third region does not include the back-surface ground line in a location overlapped with the signal line; and the second region does not include the back-surface ground line in a location overlapped with the signal line or does include the back-surface ground line being arranged so that a distance between the signal line and the back-surface ground line is longer than a distance between the signal line and the surface ground line.

According to the present invention, an optical module having excellent high-frequency transmission characteristics can be provided at a low cost.

BRIEF DESCRIPTIONS OF THE DRAWINGS

FIG. 2A is cross-sectional view illustrating a cross section structure taken along the left side of a section line A-A' of the flexible substrate of FIG. 1;

FIG. 2B is cross-sectional view illustrating a cross section structure taken along the part between the section line A-A' and a section line B-B' of the flexible substrate of FIG. 1;

FIG. 2C is cross-sectional view illustrating a cross section structure taken along the part between the section line B-B' and a section line C-C' of the flexible substrate of FIG. 1;

FIG. 2D is cross-sectional view illustrating a cross section structure taken along the part between the section line C-C' and a section line D-D' of the flexible substrate of FIG. 1;

FIG. 15A is simulation diagram illustrating an electric field vector distribution in an XY plane including a line A-A' of FIG. 13;

FIG. 15B is simulation drawing illustrating an electric field vector distribution in the XY plane including the line A-A' of FIG. 13;

FIG. 16A is simulation diagram illustrating an electric field vector distribution in an XY plane of a conventional example; and FIG. 16B is simulation diagram illustrating an electric field vector distribution in an XY plane of a conventional example.

DESCRIPTIONS OF THE PREFERRED EMBODIMENTS

Hereinafter, embodiments of the present invention will be described in detail with reference to the accompanying drawings.

Note that components having the same function are denoted by the same reference symbols throughout the drawings for describing the embodiment, and the repetitive description thereof will be omitted.

First Embodiment

Figure 1:
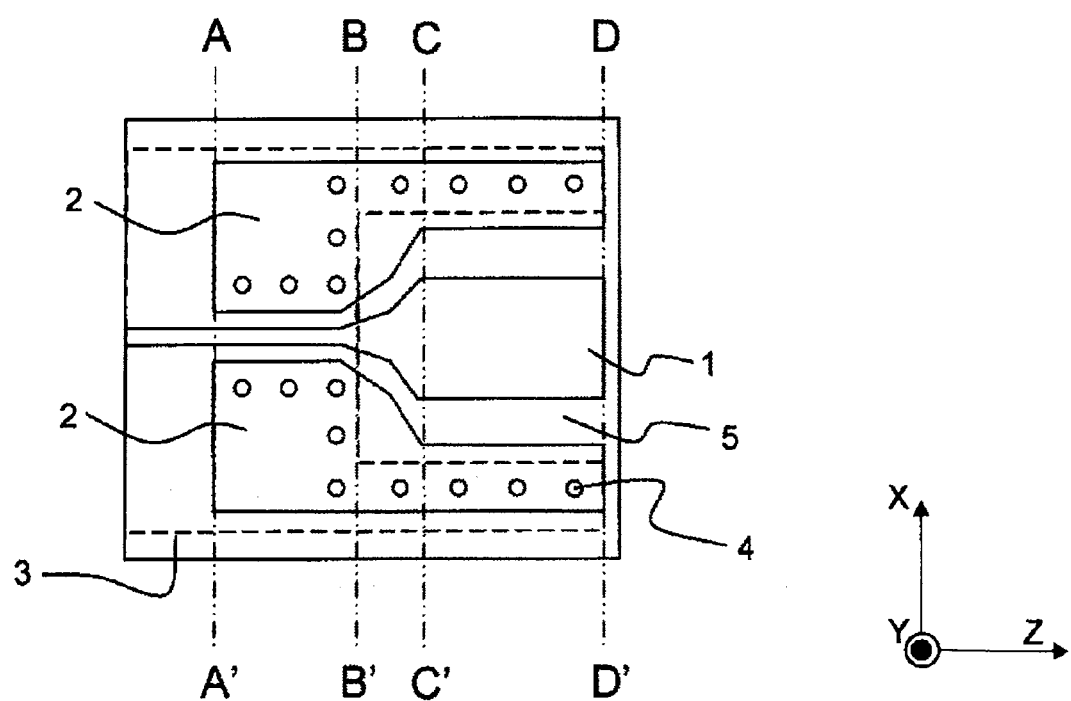
FIG. 1 is a top view illustrating a configuration of a flexible substrate of a first embodiment of the present invention.

FIG. 1 is a top view showing a configuration of a flexible substrate of a first embodiment. FIG. 2A to FIG. 2D illustrate a cross-sectional view of the left side of A-A' of FIG. 1, a cross-sectional view of the part between A-A' and B-B', a cross-sectional view of the part between B-B' and C-C', and a cross-sectional view of the part between C-C' and D-D', respectively.

In FIG. 1 and later-described FIGS. 3-5, 6, 8, 10 and 13, wiring patterns formed on a surface (upper surface) side of a base film 5 are illustrated by solid lines, and wiring patterns formed on aback surface side are illustrated by dotted lines. Hereinafter, these electrode layout patterns will be described.

As is understood from FIG. 2A to FIG. 2D, a signal line 1 to which signals representing information to be transmitted are applied and surface ground lines 2 to which a ground potential is applied are patterned on the surface side of the base film 5, and a back-surface ground line 3 to which the ground potential is applied is patterned on the back surface side. Electrical conduction is established by contact holes 4 so as to maintain an equivalent potential in the surface ground lines 2 and the back-surface ground line 3. The contact hole 4 is sometimes referred to as a via or through-hole, etc.

The flexible substrate of FIG. 1 is composed of a microstrip line on the left side of A-A' of FIG. 1, is composed of a grounded coplanar line in the part between A-A' and B-B', and is composed of a coplanar line in the part between B-B' and D-D'.

The cross-sectional view of the microstrip line of the present embodiment is illustrated in FIG. 2A. A first main surface (surface) of the base film 5, which serves as a first main surface (surface) of the flexible substrate, is provided with the signal line 1 having a first width. The signal line 1 is formed so as to have a characteristic impedance of about 50±5 ohms. The back-surface ground line 3 is formed on the entire surface of a second main surface (back surface) of the base film 5, which serves as a second main surface (back surface) of the flexible substrate. As a matter of course, the back-surface ground line 3 is overlapped with the signal line 1.

Next, the cross-sectional view of the grounded coplanar line of the present embodiment is illustrated in FIG. 2B. The surface of the base film 5 has the linear signal line 1 which maintains the width (first width) of the signal line 1 of the microstrip line unchanged and is continuous from the microstrip line. In addition, the surface of the base film 5 is provided with the surface ground lines 2, which are not formed in the microstrip line. The surface ground lines 2 are formed so as to sandwich the left and the right of the signal line 1 while maintaining constant distances between the surface ground lines 2 and the signal line 1. Furthermore, the back surface of the base film 5 is provided with the back-surface ground line 3. The back-surface ground line 3 is provided on the entire back surface of the base film 5 like that in the microstrip line. As a matter of course, the back-surface ground line 3 is overlapped with the signal line 1. An edge of the back-surface ground line 3 (bottom of a recessed part) has a shape that passes through the lower side of the signal line 1 so as to be substantially orthogonal to a signal propagating direction (Z-axis) (so as to be substantially parallel to an X-axis). This provides an advantage that, in the vicinity of the intersection of the signal line 1 and the back-surface ground line 3, the relative position of the signal line 1 and the back-surface ground line 3 to each other is not changed even when the signal line 1 and the back-surface ground line 3 have a positional misalignment in the X-axis direction, and little shift in the characteristic impedance is generated.

Next, the cross-sectional views of the coplanar line of the present embodiment are illustrated in FIG. 2C and FIG. 2D. The surface of the base film 5 is provided with the signal line 1 which is continuous from the grounded coplanar line. The width of the signal line 1 of the coplanar line is gradually increased in a part of the coplanar line that is adjacent to the grounded coplanar line-side, i.e., between B-B' and C-C' of FIG. 1. After the signal line 1 of the coplanar line obtains a second width at C-C' of FIG. 1, the width of the signal line 1 between C-C' and D-D' of FIG. 1 is constant at the second width. Since the thickness of the base film 5 is at most about 50 microns in order to maintain flexibility, the width of the signal line 1 of the microstrip line is a width of about 100 microns. Therefore, it is extremely difficult to firmly connect the signal line 1 of the coplanar line with a lead pin by soldering. Therefore, the width of the signal line 1 of the coplanar line is changed to the second width, which is wider than the first width serving as the line width of the signal line 1 of the grounded coplanar line and the microstrip line, and the signal line is fixedly attached with a lead pin by the part of the second width having the wider line width. Note that the central axis of the signal line 1 is not changed.

Furthermore, the surface of the base film 5 is provided with the surface ground lines 2, which are continuously connected from the grounded coplanar line. The surface ground lines 2 sandwich the signal line 1 like those in the grounded coplanar line. A point different from the grounded coplanar line is that the width of each of the surface ground lines 2 is gradually reduced in the part of the coplanar line that is adjacent to the grounded coplanar line-side, i.e., between B-B' and C-C' of FIG. 1 corresponding to the increase in the width of the signal line 1. In this part, the distance between the signal line 1 and each of the surface ground line 2 is gradually increased.

Furthermore, the back surface of the base film 5 is provided with the back-surface ground line 3. The back-surface ground line 3 is branched so as to provide a recessed part of a rectangular shape so that the recessed part is not overlapped with the signal line 1; and, at B-B' of FIG. 1, the back-surface ground lines 3 are arranged so as to sandwich the signal line 1 at the positions retracted to the inside of the surface ground lines 2. The part of the back-surface ground line 3 overlapped with the signal line 1 of the grounded coplanar line is terminated at the location, where the grounded coplanar line is changed to the coplanar line, and is orthogonal to the signal line 1 of the coplanar line. After the branched back-surface ground line 3 is separated from the central axis of the signal line 1 of the microstrip line, the back-surface ground line 3 is configured so as to maintain a constant distance to the signal line up to D-D' of FIG. 1. The back-surface ground line 3 is included inside the surface ground lines 2. The distance (T1 in FIG. 2C) between the surface ground line 2 and the back-surface ground line 3 is set to be T1>0, in order to achieve a value in consideration of the positional misalignment of the surface/back surface conductor patterns. In the present embodiment, the distance is set to be 50 μm or more. As a result of such setting, even if the positional misalignment occurs, the electromagnetic field distribution between these front and back conductor patterns and the signal line 1 is not largely affected. Therefore, an advantage that the transmission path on the flexible substrate having a small shift of characteristic impedance and small reflection loss is achieved is provided. Moreover, even when a positional misalignment of the signal line 1 and the back-surface ground line 3 occurs, the spreading of the electromagnetic field on the left and right of the signal line 1 (XY plane) is balanced; and, when the signal line is connected with a package equipped with a lead pin, there is an advantage that electromagnetic field radiation is small.

A characteristic structure of the present invention resides in the positional relation between the surface ground lines 2 and the back-surface ground line 3 from B-B' to C-C', described above. More specifically, the pattern and layout of the surface ground lines 2 and the back-surface ground line 3 are adjusted with respect to the signal line 1 so that the electromagnetic field strength between the signal line 1 and the surface ground line 2 in the region of the coplanar line that is adjacent to the grounded coplanar line is stronger than the electromagnetic field strength between the signal line 1 and the back-surface ground line 3, i.e., so that the electromagnetic field distribution between the signal line 1 and the surface ground line 2 becomes dominant. Specifically, the distance between the signal line 1 and the surface ground line 2 is set to be shorter than the distance between the signal line 1 and the back-surface ground line 3. Even when the signal line 1 of the surface and the ground line 3 of the back surface are accompanied by a positional misalignment when the flexible substrate is actually manufactured, a shift in the characteristic impedance is not readily caused, and, particularly, the electromagnetic field distribution on the left and right of the signal propagating direction is not readily unbalanced. Therefore, in the present embodiment, the electromagnetic field distributions of the flexible substrate and the transmission path above the package of the optical module match (are aligned) on the left and the right; therefore, radiation of electromagnetic waves, etc. are not readily caused. Moreover, even when a positional misalignment of the conductor patterns of the surface and the back surface is caused, characteristics are not largely affected. Therefore, although all products have to be subjected to the examination of the positional misalignment amount of the flexible substrate when the positional misalignment is to be prevented, the manufacturing process can be simplified since the examination step can be omitted when the flexible substrate of the present embodiment is used.

As described above, according to the present embodiment, even when the examination step of the flexible substrate in the manufacturing process is omitted, the optical module capable of achieving excellent transmission characteristics of high-frequency signals can be provided.

Figure 13:
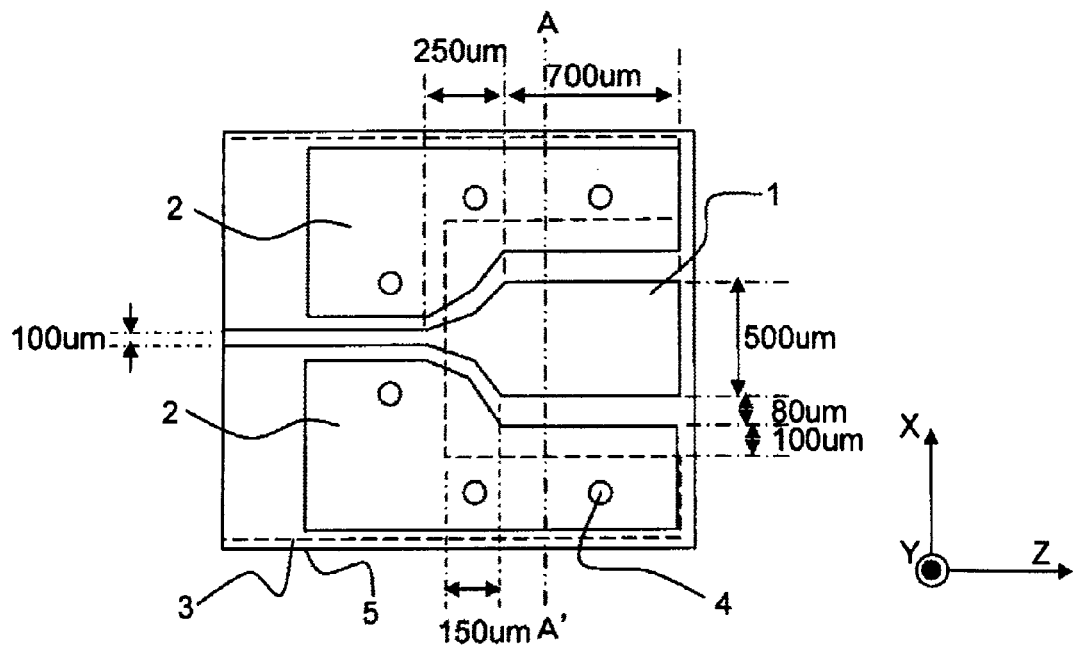
FIG. 13 is an upper-surface model diagram of a flexible substrate for examination of effects by calculations.
Figure 14:
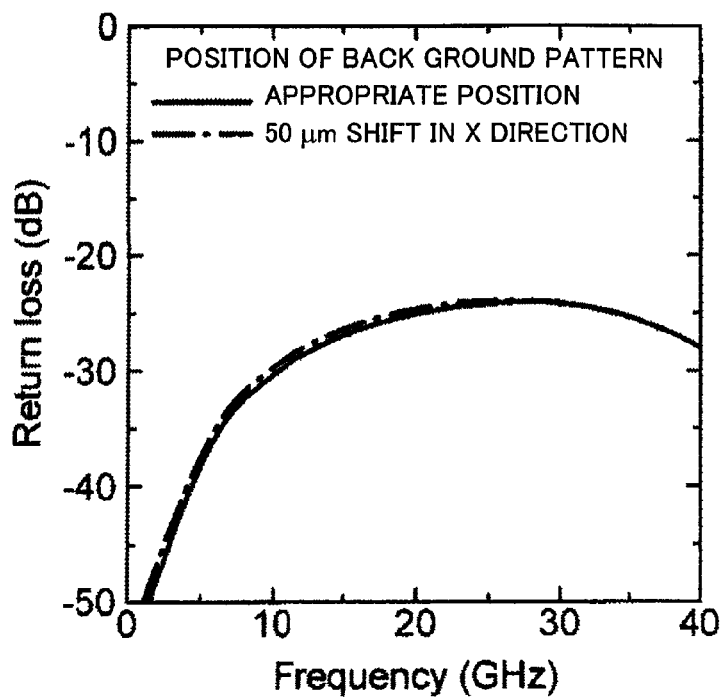
FIG. 14 is a graph illustrating the calculation results of the examination of the effects.

FIG. 13 illustrates a model of a simulation for examining the effects, and FIG. 14 illustrates a graph illustrating calculation results.

In the model illustrated in FIG. 13, the signal line 1 and the surface ground lines 2 were patterned to have a thickness of 30 microns on the base film 5 having a dielectric constant of 3.5 and a film thickness of 50 microns. The signal line 1 was converted from a microstrip line having a wiring width of 90 microns to a coplanar line having a width of 600 microns. The signal line 1 was tapered for 250 microns in a signal transmitting direction, and the edge of the ground line 3 of the back-surface side (bottom of a recessed part) was substantially orthogonal to the signal transmitting direction at a location that is 150 microns from the coplanar line part.

The conduction between the surface ground lines 2 and the back-surface ground line 3 was established by the contact holes 4. Note that, in the simulation, the three-dimensional electromagnetic field simulator HFSS™ of Ansoft Corporation was used. Electric field vector distributions were observed when the frequency of a high-frequency signal was 25 GHz.

FIG. 14 illustrates frequency characteristics of reflection loss (return loss) in the case in which the back-surface ground line 3 was at an appropriate position and in the case in which the back-surface ground line 3 was shifted in the X-axis direction by 50 microns. Even when the back-surface ground line 3 was shifted, the reflection loss was increased little up to about 40 GHz, and thus the effects can be confirmed.

FIGS. 15A and 15B are simulation diagrams illustrating the electric field vector distributions in the XY plane including the line A-A' of FIG. 13. Note that, in FIGS. 15A and 15B, the frequency of the high-frequency signal is 25 GHz. FIG. 15A illustrates the electric field vector distribution of the case in which the surface ground lines 2 and the back-surface ground line 3 are at appropriate positions, and FIG. 15B illustrates the electric field vector distribution of the case in which the edge of the back-surface ground line 3 is shifted in the X-axis direction by 50 microns.

In FIG. 15A and FIG. 15B, it can be understood that the electric field vector distributions are changed little, and a symmetry is substantially maintained in the positive direction and the negative direction of the X-axis. Thus, it can be understood that the electric field vector distribution is maintained to be substantially symmetric in the positive direction and the negative direction of the X-axis when the surface ground lines 2 are closer to the transmission path by 50 microns than the back-surface ground line 3 is.

FIGS. 16A and 16B are simulation diagrams illustrating electric field vector distributions in the XY-plane of a conventional example. Note that, in FIGS. 16A and 16B, the frequency of the high-frequency signal is 25 GHz.

FIG. 16A illustrates an electric field distribution when the surface ground lines 2 and the back-surface ground line 3 are at appropriate positions. In the simulation, the ground line 3 is closer to the signal line 1 by 100 microns in the X-axis direction than the ground lines 2 are.

FIG. 16B illustrates an electric field distribution of the case in which the edge of the back-surface ground line 3 is shifted by 50 microns in the X-axis direction. In FIG. 16A, the electric field vector distribution is laterally symmetrical (symmetrical in the positive direction and the negative direction of the X-axis); however, in FIG. 16B, the distribution is apparently laterally asymmetrical. When the flexible substrate illustrated in FIG. 16B is connected to a package, there has been a problem that electromagnetic wave radiation, which is a cause of noise, occurs since the electric field vector distribution is rapidly changed. According to the present embodiment, as illustrated in FIGS. 15A and 15B, the electric fields having equivalent strengths are formed substantially symmetrical to the signal line 1. Therefore, it can be understood that the present embodiment is excellent in high-frequency transmission compared with the conventional technique illustrated in FIGS. 16A and 16B.

As described above, the flexible substrate of the present embodiment has advantages that the transmission characteristics of high-frequency signals are excellent even when the frequency of the high-frequency signal propagating through the signal line 1 is 10 GHz or more, particularly 25 GHz or more, and that electromagnetic field radiation is reduced even when the flexible substrate is connected with a package.

Second Embodiment

Figure 3:
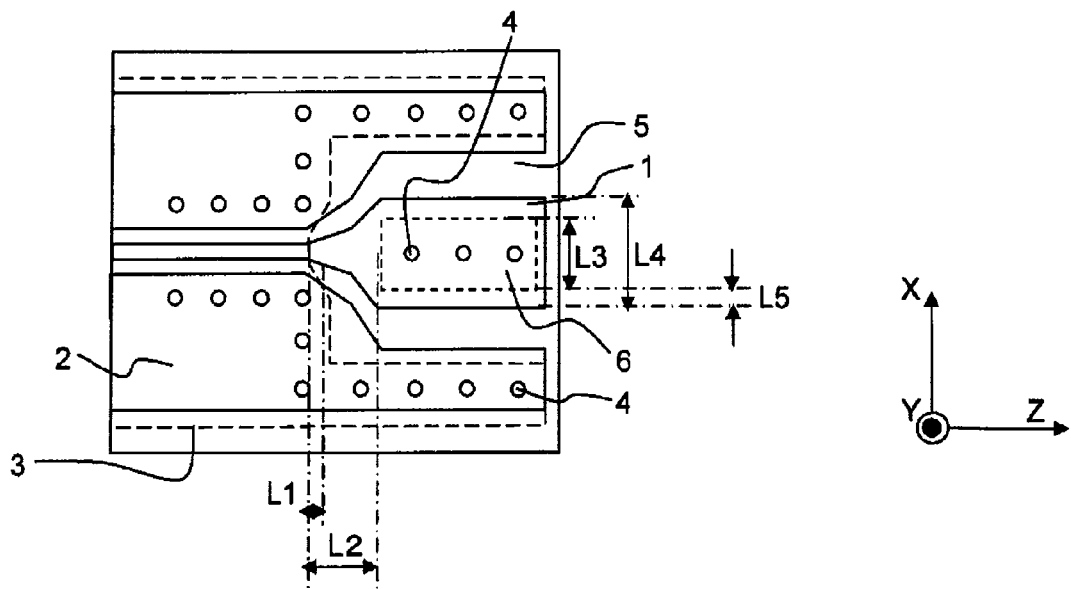
FIG. 3 is a top view illustrating a configuration of a flexible substrate of a second embodiment of the present invention.
Figure 4:
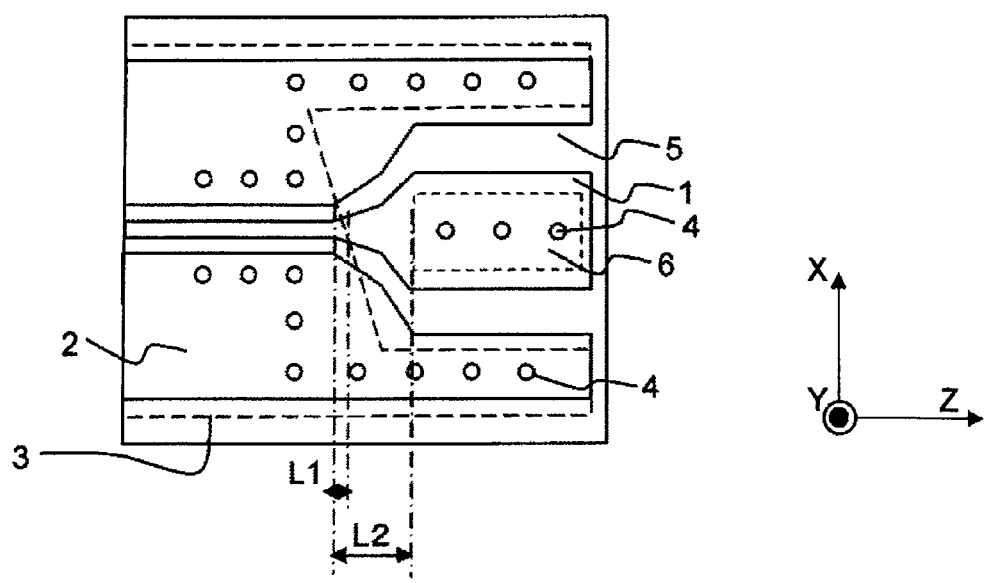
FIG. 4 is a top view illustrating a configuration of a modification example of the flexible substrate of the second embodiment of the present invention.

FIG. 3 is a top view illustrating a configuration of a flexible substrate of a second embodiment of the present invention, and FIG. 4 is a top view illustrating a configuration of a modification example of the flexible substrate of the second embodiment of the present invention.

FIG. 3 and FIG. 1 have two different points. The first different point is that a signal pad 6 connected by contact holes 4 are patterned on the back surface that is overlapped with the signal line 1 in the coplanar line. A lead pin can be fixedly attached by the signal pad 6 from the back-surface side of the flexible substrate.

A width L3 of the signal pad 6 is narrower than a width L4 of the coplanar line of the signal line 1. In other words, the signal line 1 of the surface side is closer to the ground lines 2 than the signal pad 6 of the back-surface side is. Thus, there are advantages that the influence exerted on the characteristic impedance by the signal pad 6, which is patterned on the back-surface side of the flexible substrate, is small, and that variation in the characteristic impedance is small even when there is a positional misalignment of the patterns of the surface side and the back surface side of the flexible substrate. Specifically, L5 is preferable to be designed to be 50 microns or more after manufacturing.

The other different point of FIG. 3 is that the back-surface ground line 3 is not rectangular, and a concave notch is formed with multiple tapering in the part where the signal line 1 and the edge of the back-surface ground line 3 (bottom of the recessed part) are intersecting with each other, so that the edge of the back-surface ground line 3 surrounds the signal line 1.

A different point between FIG. 4 and FIG. 1 is that, in the part where the signal line 1 of the grounded coplanar line of FIG. 1 and the edge of the back-surface ground line 3 are intersecting with each other, the edge of the back-surface ground line 3 (bottom of the recessed part) is angularly intersecting with the signal propagating direction (Z-axis direction), which is the extending direction of the signal line 1. More specifically, in FIG. 3 and FIG. 4, in terms of the distance L1, the back-surface ground line 3 is closer to the signal line 1 than the surface ground line 2 is; and, when L1 is less than or equal to one-third of the length L2 of the converting part of the signal line 1, it can be said that the edge of the back-surface ground line 3 is substantially orthogonal to the signal propagating direction. Even when they are mutually shifted to the left or right, merely the lengths of the grounded coplanar region and the coplanar region are changed, and high-frequency characteristics are not largely affected in this structure.

Third Embodiment

Figure 5:
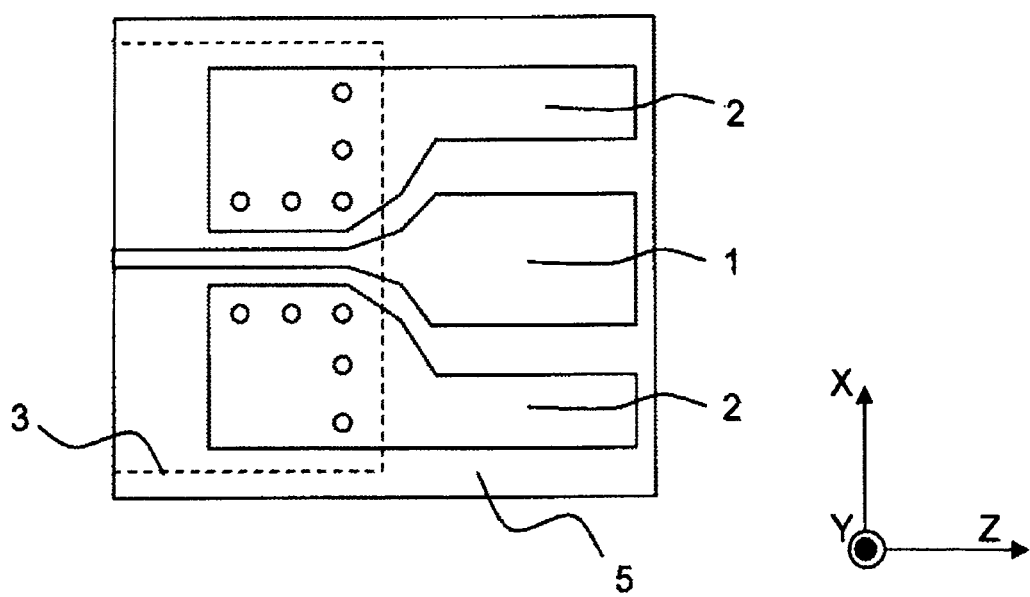
FIG. 5 is a top view illustrating a configuration of a flexible substrate of a third embodiment of the present invention.

FIG. 5 is a top view showing a configuration of a flexible substrate of a third embodiment of the present invention.

A point largely changed from FIG. 1 is that the back-surface ground line 3 is not provided in the coplanar line. The characteristic impedance of this part is maintained substantially only by the distances between the signal line 1 and the surface ground lines 2. This case has an advantage that a variation in the characteristic impedance due to the surface/back surface pattern positional misalignment in the X-axis direction is almost completely eliminated even when the positional misalignment of the surface/back surface patterns of the flexible substrate is particularly large.

Fourth Embodiment

Figure 6:
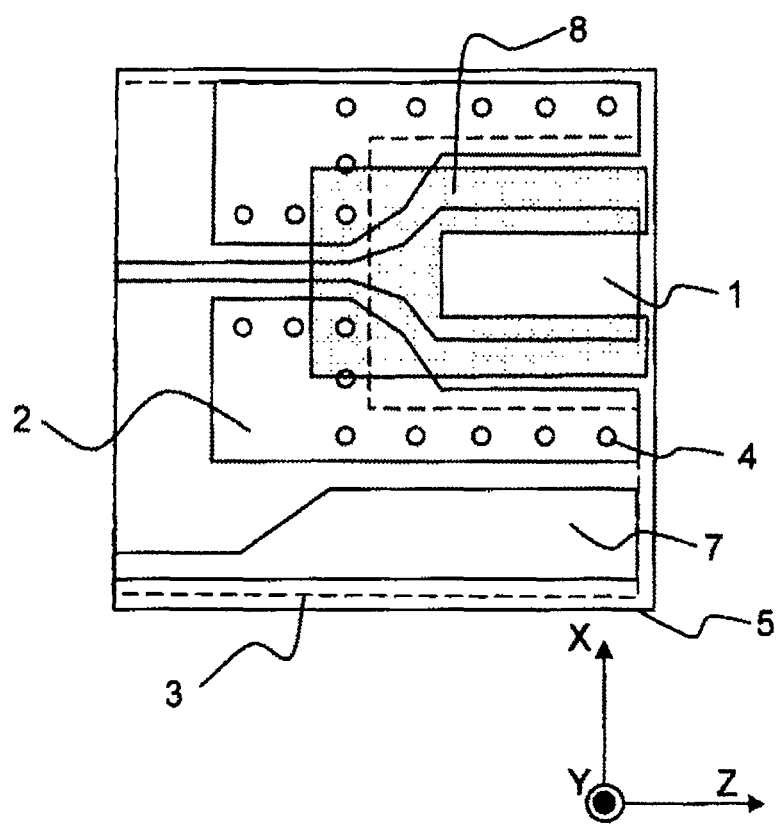
FIG. 6 is a top view illustrating a configuration of a flexible substrate of a fourth embodiment of the present invention.
Figure 7:
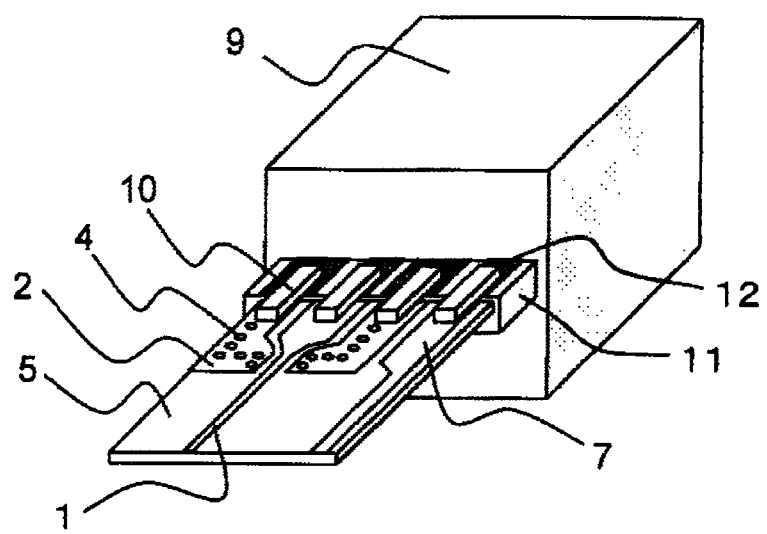
FIG. 7 is a diagram illustrating a state of the flexible substrate illustrated in FIG. 6 being mounted on a package having lead pins.

FIG. 6 is a top view illustrating a configuration of a flexible substrate of a fourth embodiment of the present invention, and FIG. 7 is a diagram illustrating a state in which the flexible substrate illustrated in FIG. 6 is mounted on a package 9 having lead pins 10.

The package 9 for optical communications has a structure in which optical elements and electronic elements mounted in the interior thereof are air-tightly sealed, and the package 9 is made of a ceramic, metal, or the like. A pattern 12 on a ceramic substrate 11 is conducted to transmission paths in the package 9.

The lead pins 10 are fixedly attached onto the pattern 12 by a metal of solder or the like. The lead pins 10 are fixedly attached by soldering to the signal line 1, the surface ground lines 2, and a wiring pattern 7 of a power source and bias, etc.

Meanwhile, the flexible substrate of FIG. 6 is different from FIG. 1 in the point that a resin 8 having a concave portion provided with a rectangular notch is formed on a part of the signal line 1 and the surface ground lines 2. This is for preventing short-circuiting between the signal line 1 and the surface ground lines 2 due to soldering when the lead pin 10 is to be fixedly attached onto the signal line by soldering or the like. Note that, in the present embodiment and a fifth embodiment, which will be described later, an organic film can be used instead of the resin 8.

In the present embodiment, in the coplanar line of the signal line 1, the characteristic impedance is controlled to be substantially constant by the signal line 1 and the surface ground lines 2. Since the signal line 1 and the surface ground lines 2 are patterned on the same surface, they can be formed by one-time processing, and the line widths and gaps between the lines can be controlled with a tolerance of ±10 microns or less.

Therefore, the electromagnetic field distribution formed by the signal line 1 and the surface ground lines 2 is excellent in isotropy. This case has advantages that the distribution is readily matched (aligned) with the electromagnetic field distribution formed by the signal which goes through the pattern 12 on the ceramic substrate 11 and that electromagnetic field radiation does not readily occur in the connecting part of the flexible substrate and the package 9.

Moreover, since the ground line 3 of the back surface side does not affect the characteristic impedance, the signal line 1 and the surface ground lines 2 are wide lines. Therefore, it is easy to adjust the position of the lead pin 10 onto the signal line 1 or the surface ground line 2, and there is an advantage that the lead pin can be firmly fixedly attached even when it is fixedly attached with a positional misalignment.

For example, when the signal line 1 is patterned on a base film having a dielectric constant of about 3.5, in the coplanar line, the signal line 1 has a width of about 500 microns, and the gap between the wiring pattern 7 and the surface ground line 2 is about 80 microns. Therefore, a lead pin of about 200 microns can be sufficiently attached by soldering even when the lead pin is shifted by about 100 microns to the left or right from the center part of the coplanar line.

Fifth Embodiment

Figure 8:
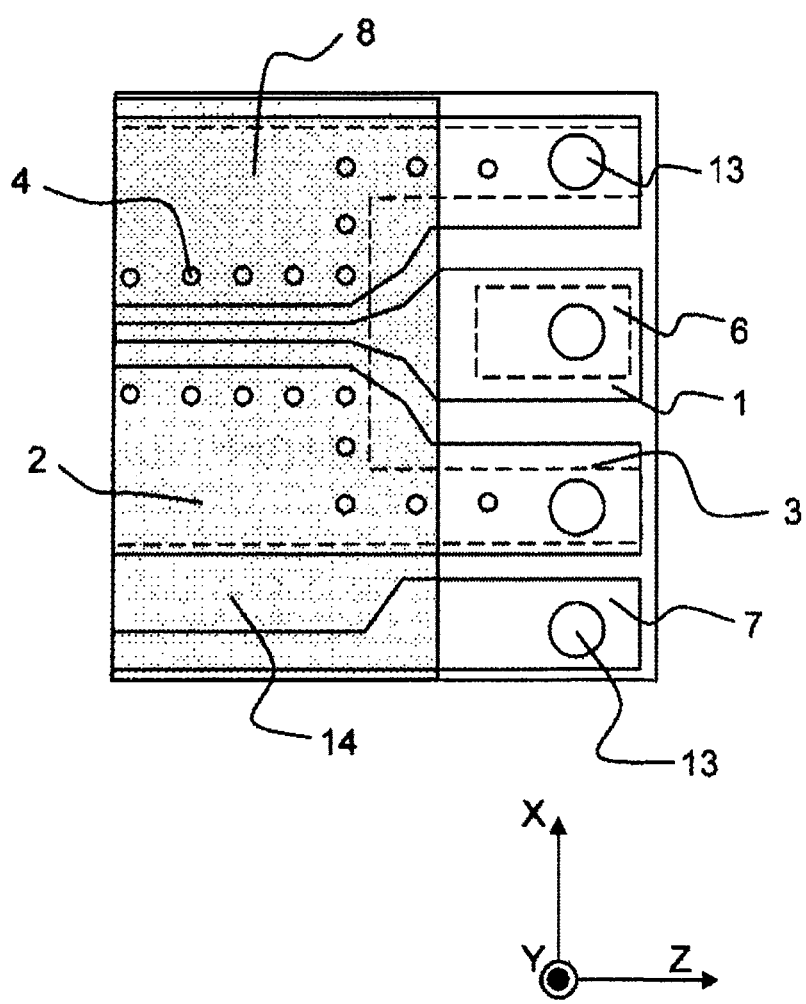
FIG. 8 is a top view illustrating a configuration example of a flexible substrate of a fifth embodiment of the present invention.
Figure 9:
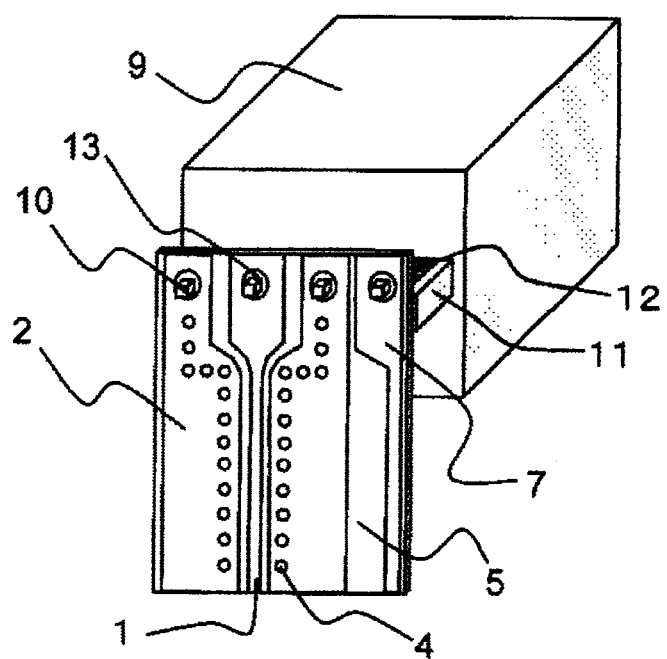
FIG. 9 is a diagram illustrating a state of the flexible substrate illustrated in FIG. 8 being mounted on a package having lead pins.

FIG. 8 is a top view illustrating a configuration example of a flexible substrate of the fifth embodiment of the present invention, and FIG. 9 is a diagram showing the state in which the flexible substrate illustrated in FIG. 8 is mounted on the package 9 having the lead pins 10.

FIG. 8 and FIG. 3 are largely different in the point that the signal line 1 and the surface ground lines 2 are patterned on the base film 5 of the flexible substrate where the resin 8 is applied thereon and the point that the wiring pattern 7 is disposed. The resin 8 is provided for preventing corrosion of the signal line 1 and the surface ground lines 2 and for preventing occurrence of short-circuiting or the like between the patterns due to adhesion of solder or a metal, etc. in the part where distances between patterns are narrow.

Holes 13 are provided in the signal line 1, the surface ground lines 2, the back-surface ground line 3, and the wiring pattern 7. The lead pins 10 are caused to penetrate through the holes 13, and then the lead pins are fixedly attached by soldering with the signal line 1 and the surface ground lines 2, etc. by solder or the like. The solder is readily fixedly attached when the holes 13 are through-holes having metalized inner walls.

In the present embodiment, in the coplanar line of the signal line 1, the characteristic impedance is controlled to be substantially constant by the signal line 1 and the surface ground lines 2. In such a case, the signal line 1 is a wide line. Therefore, it is easy to provide the hole 13 in the signal line 1. For example, when the signal line 1 is patterned on a base film having a dielectric constant of about 3.5, the width of the signal line 1 is about 500 microns in the coplanar line part, and the gap between the wiring 7 and the surface ground line 2 is about 80 microns. When penetrating a lead pin of about 200 microns thorough the hole 13, the hole 13 having a diameter of about 300 microns is sufficient, and providing the hole 13 in the coplanar line having a width of 500 microns is easy even when a positional misalignment in manufacture is taken into consideration.

Sixth Embodiment

Figure 10:
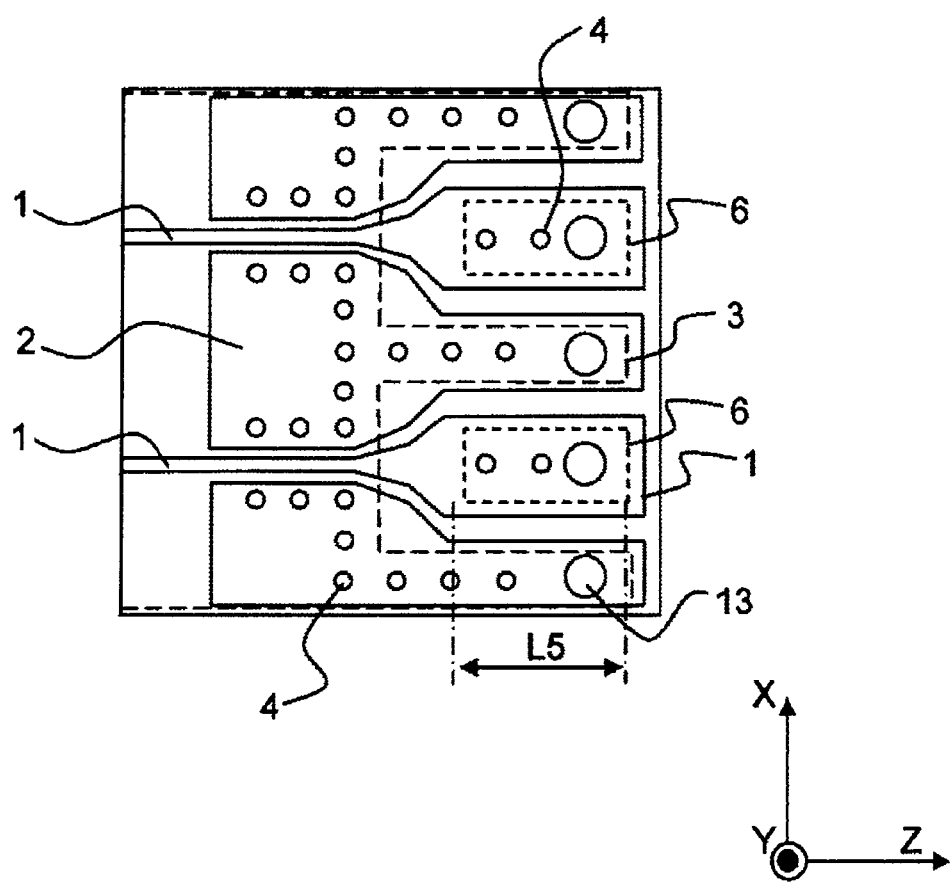
FIG. 10 is a top view illustrating a configuration of a flexible substrate of a sixth embodiment of the present invention.
Figure 11:
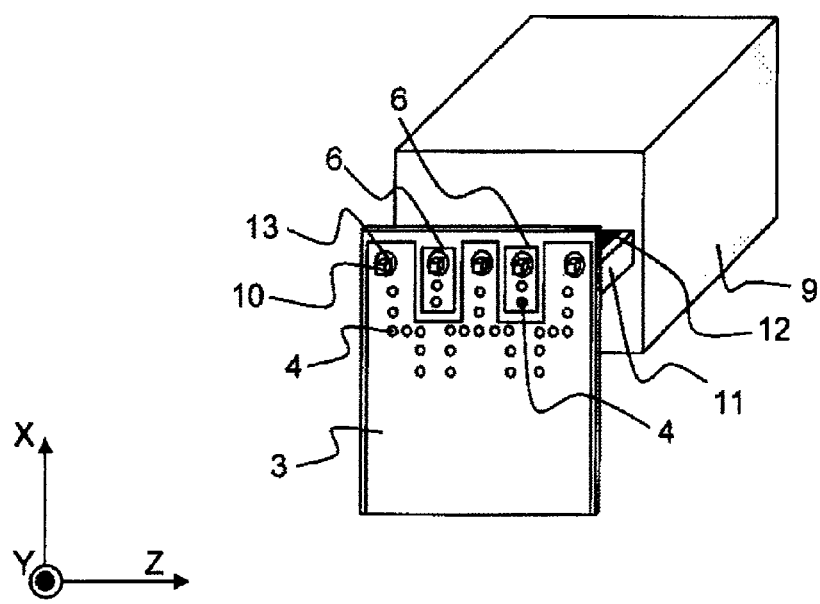
FIG. 11 is a diagram illustrating the state of the flexible substrate illustrated in FIG. 10 being mounted on a package having lead pins.

FIG. 10 is a top view illustrating a configuration of a flexible substrate of a sixth embodiment of the present invention, and FIG. 11 is a diagram illustrating a state in which the flexible substrate illustrated in FIG. 10 is mounted on a package 9 having lead pins 10.

In the present embodiment, the flexible substrate is mounted so that the surface side of the flexible substrate is directed toward the package 9. A pair of two signal lines 1 serves as a differential line, and, generally, the characteristic impedance of the differential line is designed to be about 100 ohms. Signal pads 6 are formed on the back surface side of the signal lines 1, and holes 13 are provided in the signal pads 6 and the signal lines 1.

The lead pins 10 are caused to penetrate through the holes 13, and then the lead pins 10 are fixedly attached by soldering with the signal lines 1 and surface ground lines 2, etc. by solder or the like. The solder is readily fixedly attached when the holes 13 are through-holes having metalized inner walls.

Other than the holes 13, a plurality of contact holes 4 are provided in the signal lines 1 and the signal pads 6 in order to reduce the inductance between the conductors. Providing the contact holes 4 in this manner is effective. However, when the plurality of contact holes 4 and the holes 13 are provided, a distance L5 becomes 1 mm or more.

In such a case, as is mentioned in the embodiments, the back-surface ground line 3 is closer to the signal line 1 than the surface ground line 2 is; and, when the characteristic impedance is subjected to control, a variation in the characteristic impedance caused by a positional misalignment of the surface/back surface patterns of the flexible substrate is extremely large. However, in the present embodiment, the surface ground line 2 and the signal line 1 are close to each other; therefore, the variation in the characteristic impedance caused by the positional misalignment of the patterns can be suppressed.

Seventh Embodiment

Figure 12:
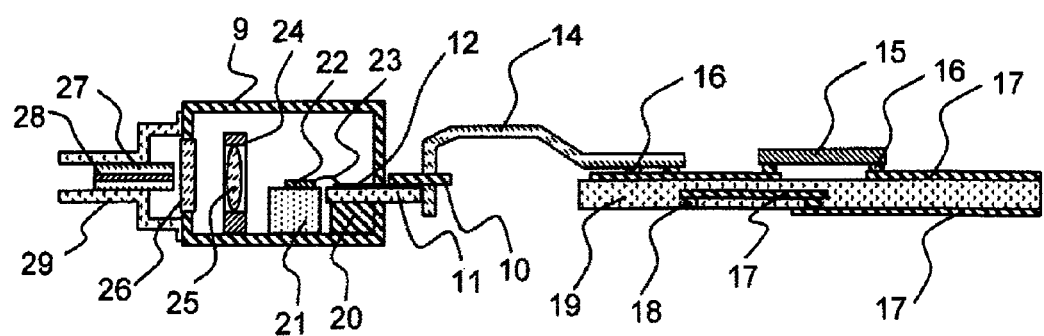
FIG. 12 is a cross-sectional view for describing an optical transceiver provided with the flexible substrate of any of the embodiments of the present invention.

FIG. 12 is a cross-sectional view for describing an optical transceiver provided with the flexible substrate of any of the embodiments of the present invention.

The optical transceiver of the present embodiment is composed of an optical module and a flexible substrate 14. An optical element 22 mounted on a submount 21 is mounted in the package 9 of the optical module, and an optical coupling between the optical element 22 and a fiber 28 is made by a lens 25, which is fixed by a lens holder 24. Note that a pedestal is denoted by 20, a sleeve is denoted by 27, and a fiber holder is denoted by 29.

In order to air-tightly seal the interior, the package 9 is made of a ceramic or a metal, and the part through which optical signals pass is glass 26. Input/output of electric signals from the interior of the package 9 to the outside is formed by the pattern 12, which is patterned on the ceramic substrate 11.

The lead pins 10, which are fixed by solder or a metal, are fixedly attached onto the pattern 12. The lead pins 10 are fixed to the flexible substrate 14, where a method of fixing is as illustrated in FIG. 9, etc.

A wiring pattern 17 and through-holes 18 are formed on a printed board 19, which is in the optical transceiver, and the wiring pattern 17 and the wiring pattern 12 fixed to the flexible substrate 14 are fixedly attached to each other by solder 16. Electronic elements such as an LSI 15, etc. are mounted on the printed board 19.

According to the present embodiment, an optical module using a flexible substrate which is utilized in the high-speed optical communication field is provided. The optical module is enclosed and utilized for communication such as in an optical transceiver, optical receiver, and optical transmitter having a communication capacity of 10 Gbps or more.

In the foregoing, the present invention made by the inventor has been concretely described based on the described embodiments. However, it is needless to say that the present invention is not limited to the foregoing embodiments and various modifications and alterations can be made within the scope of the present invention.

What is claimed is:

1. An optical module comprising:
a circuit board;
a flexible substrate connected to the circuit board; and
a package including a lead pin, the lead pin being fixedly attached to the flexible substrate,
wherein:
the flexible substrate includes a transmission path having a signal line, a pair of surface ground lines, and a back-surface ground line, the signal line and the surface ground lines being provided on a first main surface of the flexible substrate, the surface ground lines being arranged on the left and right of the signal line with a gap therebetween, and the back-surface around line being provided on a second main surface of the flexible substrate opposed to the first main surface,
the transmission path includes a first region, a second region, and a third region in this order toward the package,
the first region, the second region, and the third region include the signal line and the surface around lines,
the first region includes the back-surface ground line which is overlapped with the signal line and terminated within the first region;
the third region does not include the back-surface ground line in a location overlapped with the signal line,
the second region does not include the back-surface ground line in a location overlapped with the signal line or does include the back-surface ground line being arranged so that a distance between the signal line and the back-surface ground line is longer than a distance between the signal line and the surface ground line, and
the signal line includes:
a part present in the first region and having a first width;
a part present in the third region and having a third width; and
a part present in the second region and having a width varied from the first width to the third width.

2. The optical module according to claim 1, wherein the surface ground line in the second region gradually gets away from a central axis of the signal line.

3. The optical module according to claim 1, wherein the back-surface ground line is provided below the surface ground line in the third region.

4. The optical module according to claim 3, wherein the back-surface ground line below the surface ground line is connected with the surface ground line by a contact hole.

5. The optical module according to claim 1, wherein the back-surface ground line is provided below the surface ground line in the second region.

6. The optical module according to claim 5, wherein the back-surface ground line below the surface ground line is connected with the surface ground line by a contact hole.

7. The optical module according to claim 1, wherein each of the signal line and the surface ground lines constituting the flexible substrate is connected with the lead pin in the third region.

8. The optical module according to claim 1, wherein the terminal of the back-surface ground line overlapped with the signal line in the first region is orthogonal to or forming a predetermined angle with respect to an extending direction of the signal line.

9. The optical module according to claim 1, wherein the flexible substrate has a fourth region adjacent to a side of the first region, the side being opposite to the second region;
the fourth region includes a microstrip line having the back-surface ground line overlapped with the signal line without the pair of surface ground lines; and
a characteristic impedance of the transmission path in the second region is within ±5 ohms from a characteristic impedance of the microstrip transmission path in the fourth region.

10. The optical module according to claim 1, wherein the signal line and the pair of surface ground lines include a part covered with an organic film or a resin.

11. The optical module according to claim 1, wherein a frequency of a signal propagating through the transmission path is 10 GHz or higher.

12. The optical module according to claim 11, wherein the frequency of the signal propagating through the transmission path is 25 GHz or higher.

* * * * *